United States Patent
Tseng et al.

(10) Patent No.: US 6,853,550 B2
(45) Date of Patent: Feb. 8, 2005

(54) ASSEMBLY STRUCTURE OF ELECTRONIC CARD

(75) Inventors: Tien-Chih Tseng, Taipei (TW); Vincent Chen, Taipei (TW)

(73) Assignee: Longwell Company, Taipei (TW)

( * ) Notice: Subject to any disclaimer, the term of this patent is extended or adjusted under 35 U.S.C. 154(b) by 0 days.

(21) Appl. No.: 10/717,472

(22) Filed: Nov. 21, 2003

(65) Prior Publication Data

US 2004/0114314 A1 Jun. 17, 2004

Related U.S. Application Data

(62) Division of application No. 10/171,659, filed on Jun. 17, 2002.

(51) Int. Cl.[7] .................................................. H05K 7/10
(52) U.S. Cl. ...................... 361/685; 361/736; 439/76.1; 174/35 R
(58) Field of Search ............................... 361/680–687, 361/724–727, 736–737, 816, 818, 752, 785; 439/76.1, 101, 108; 235/486, 492; 174/52.1

(56) References Cited

U.S. PATENT DOCUMENTS 5,716,221 A * 2/1998 Kantner ........................ 439/64
5,760,998 A * 6/1998 Berberich et al. ......... 360/97.02
6,353,534 B1 * 3/2002 Chen ............................ 361/684

* cited by examiner

Primary Examiner—Hung Van Duong
(74) Attorney, Agent, or Firm—Rosenberg, Klein & Lee (57) ABSTRACT

The present invention provides an assembly structure of electronic card comprising two cover bodies. Bent portions are formed at two ends of each of the cover bodies. A plurality of positioning pieces each having an interference piece on the outer surface thereof are extended from one of the bent portions. The other bent portion is bent inwards to form a bent piece with a slot formed at the front end of the bottom face thereof. A hook body is extended from behind the slot and the bottom face of the bent piece. A plurality of connection holes are formed at the boundary between the hook body and the bent piece. Insertion pieces are formed at two sides of the font end of the cover bodies. Two ends of a frame are extended to form clamping arms having positioning grooves for clamping a connector. The two cover bodies sheathe a circuit board up and down. The positioning pieces are retained in the slot and the connection holes to engage the two cover bodies. The insertion pieces are fixedly retained in the positioning grooves to join the frame and the cover bodies together. The present invention has a high degree of joint, and can be assembled by a user himself.

2 Claims, 13 Drawing Sheets

ASSEMBLY STRUCTURE OF ELECTRONIC CARD

This is a division of application No. 10/171,659, filed Jun. 17, 2002.

FIELD OF THE INVENTION

The present invention relates to an electronic card structure and, more particularly, to an improved assembly structure of electronic card.

BACKGROUND OF THE INVENTION

Along with continual development of scientific technology, various kinds of electronic products tend to be compact. In order to enhance life's fun and convenience, it is necessary to store various kinds of data in these portable electronic products. Therefore, many electronic cards come into being to expand various kinds of functions within limited space.

A common electronic card comprises a printed circuit with two cover bodies respectively disposed above and below it. Joining of the upper and lower cover bodies is exploited to install the printed circuit board therein. A connector soldered to the printed circuit board is disposed at the front end of the two cover bodies to install the electronic card on a motherboard. In a prior art electronic card, the joining of the upper and lower cover bodies is accomplished using supersonic wave, thermal glue, or blanket glue. The processing procedure is cumbersome, and the production time is longer so the production cost is higher. Furthermore, this kind of design easily lets the joined position be held open when an electronic card is bent, hence resulting in damage of the electronic card and reducing shielding effect of the electronic card.

Accordingly, the present invention aims to propose an improved electronic card structure assembled totally in retaining way.

SUMMARY OF THE INVENTION

The primary object of the present invention is to propose an electronic card structure assembled totally in retaining way without the need of bonding process. The electronic card thus can be easily assembled by a user himself.

Another object of the present invention is to propose an assembly structure of electronic card with good shielding effect so as to have better grounding effect.

Yet another object of the present invention is to propose an assembly structure of electronic card with high degree of joint, which can shorten the production time to reduce the cost.

Yet another object of the present invention is to propose an electronic card structure, wherein a frame is used only at the front section of the electronic card to facilitate collocation and design of different circuit boards inside the electronic card. Moreover, rear covers at the rear end of the electronic card can be assembled by a user himself.

Still yet another object of the present invention is to propose an electronic card structure capable of using connectors of different types to enhance the compatibility of the electronic card with standard interfaces.

Another object of the present invention is to propose an electronic card structure, which lets a cover body and a rear cover thereof be not easily spread due to twist of the electronic card so as to have a longer lifetime of use.

According to the present invention, an electronic card comprises two cover bodies. Bent portions are formed at two ends of each of the cover bodies. A plurality of first positioning pieces and a second positioning piece are extended in order from rear to front on one of the bent portions. First interference pieces are formed on the surfaces of the positioning pieces. The other bent portion is bent inwards to form a bent piece with a slot formed at the front end of the bottom face thereof. A hook body is extended from behind the slot and the bottom face of the bent piece. A plurality of connection holes corresponding to the first positioning pieces are formed at the boundary between the hook body and the bent piece. The two cover bodies thus cover a circuit board up and down. The first positioning pieces are retained in the connection holes and the second positioning pieces are retained in the slots to join the two cover bodies together. Each of the cover bodies forms a front and a rear extension ends. Insertion pieces are disposed at both sides of each of the extension ends. Two ends of a frame are extended to form clamping arms having positioning grooves for clamping a connector. Retaining trenches are disposed at two ends of the front sides of two rear covers so that the insertion pieces at the two sides of the front extension end can pass through the positioning grooves of the frame and the insertion pieces at the two sides of the rear extension end can pass through the retaining trenches of the rear covers. Therefore, when the two Cover bodies are joined together, the frame and the rear covers can be joined at the front and rear ends of the cover bodies, respectively.

The various objects and advantages of the present invention will be more readily understood from the following detailed description when read in conjunction with the appended drawing, in which:

DETAILED DESCRIPTION OF THE PREFERRED EMBODIMENTS

As shown in FIGS. 1, 2, 3 and 3A, an electronic card 10 comprises an upper and a lower cover bodies 12 and 12'. A first bent portion 14 and a second bent portion 14' in the same direction are respectively formed at two opposite edges of each of the cover bodies 12 and 12'. A plurality of first positioning pieces 18 are disposed on the first bent portion 14. A second positioning piece 20 is disposed at the front end of the first bent portion 14. A hole 22 is formed on each of the first positioning pieces 18 and the second positioning piece 20. An interference piece 24 is extended outwards from the inner top face of the hole 22. The second bent portion 16 is bent inwards to form a bent piece 26. A slot 28 corresponding to the second positioning piece 22 is disposed at the front end of the bottom face of the bent piece 26. A hook body 30 is extended from behind the slot 28 and the bottom edge of the bent piece 26. A plurality of connection holes 32 corresponding to the first positioning pieces 18 are formed at the boundary between the hook body 30 and the bent piece 26. The positions of the connection holes 32 correspond to those of the first positioning pieces 18. A front extension end 34 is formed at the front end of a main body 13. A first front insertion piece 36 and a second front insertion piece 38 are respectively disposed at two sides of the front extension end 34. The first front insertion piece 36 has a hole 40, and the second front insertion piece 38 has a sheet body 42. Two sides of a frame 44 are extended to form L-shaped clamping arms 46 so as to form receiving spaces 48 between the L-shaped clamping arms 46 and two ends it the fi font side of the frame 44. The surface of each of the L-shaped clamping arms 46 forms a through positioning groove 50. Connection bodies 52 extended from two ends of the rear side of the frame 44. Positioning pieces 56 are disposed at two sides of a connector 54. A plurality of contact terminals 58 at the rear side of the connector 56 are soldered to circuit contacts 62 of a circuit board 60.

Figure 2:
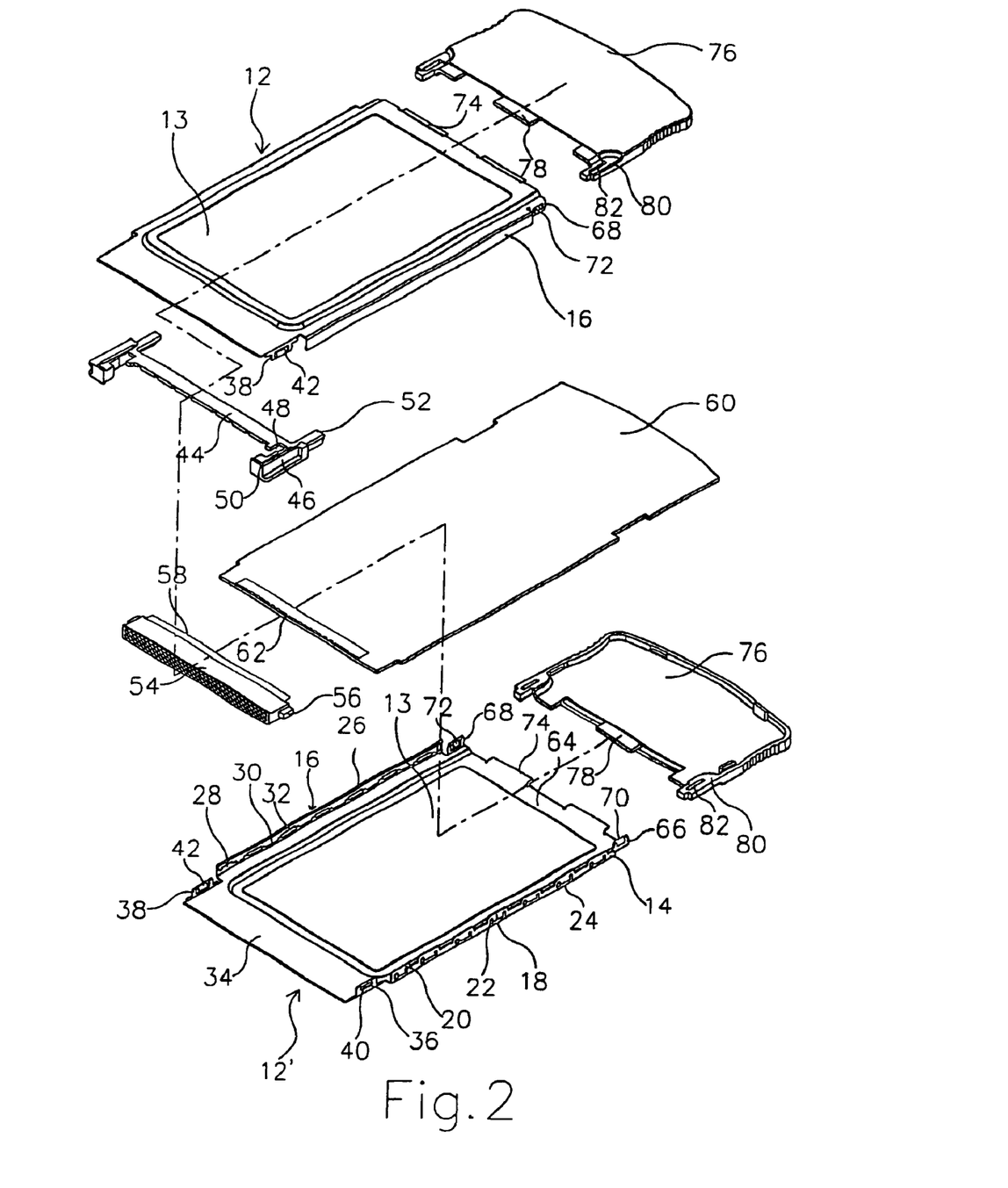
FIG. 2 is an exploded perspective view of the present invention.
Figures 3, 3A:
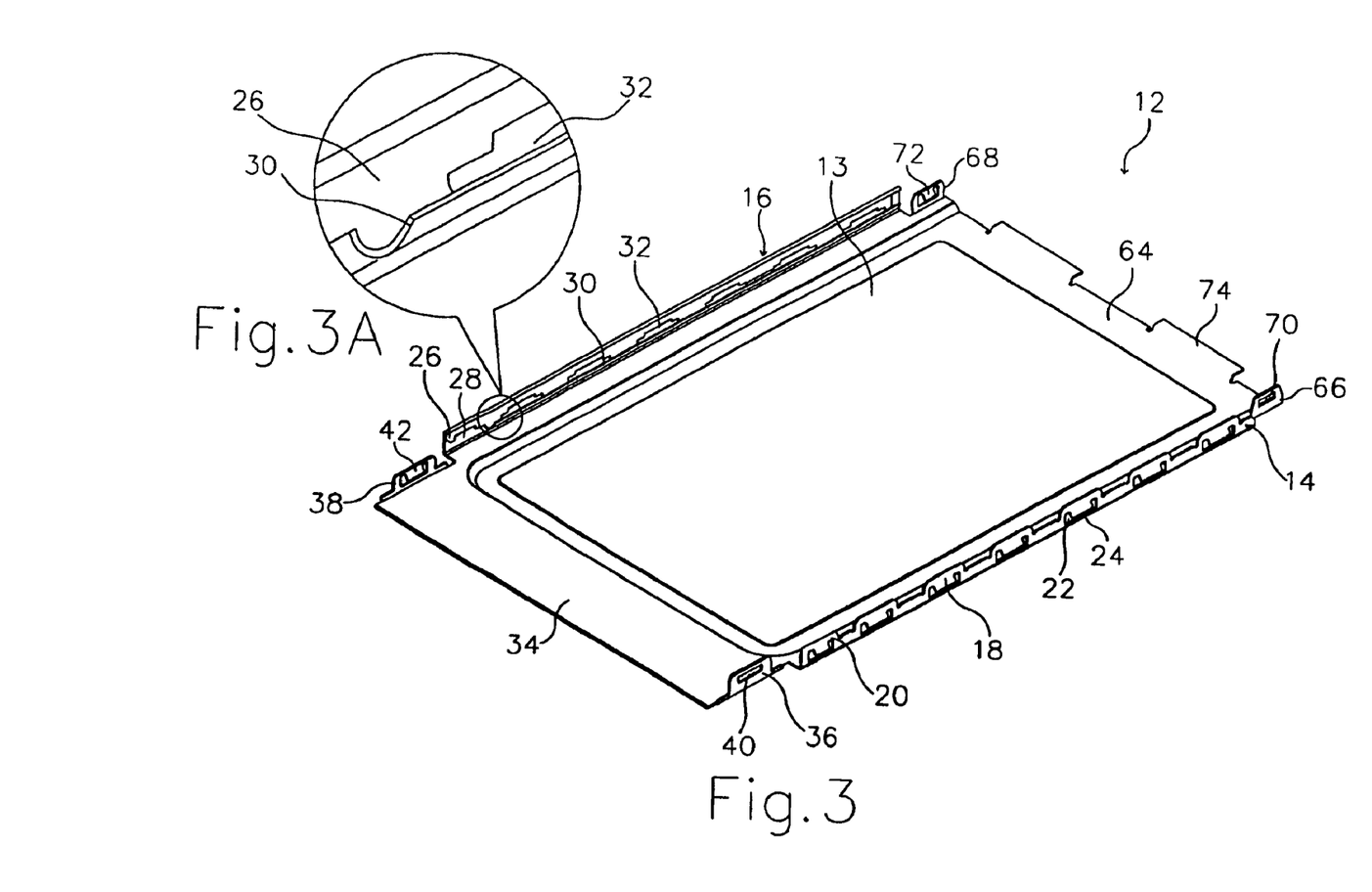
FIG. 3 and FIG. 3A are enlarged views of the cover body of the present invention.

A rear extension end 64 is formed at the rear end of the main body 13. A first rear insertion piece 66 and a second rear insertion piece 68 are respectively formed at two opposite sides of the rear extension end 64. The first rear insertion piece 66 has a hole 70, and the second rear insertion piece 68 has a sheet body 72. Two connection sheets 74 are formed at the rear end edge of the rear extension end 64. Two rear covers 76 for retaining up and down are also provided. A plugging piece 78 is extended from the center of the front edge of the rear covers 76. Connection pieces 80 are disposed at two sides of the front end of each of the two rear covers 76. A through retaining trench 82 is formed on the surface of the connection piece 80.

Figures 4, 4A:
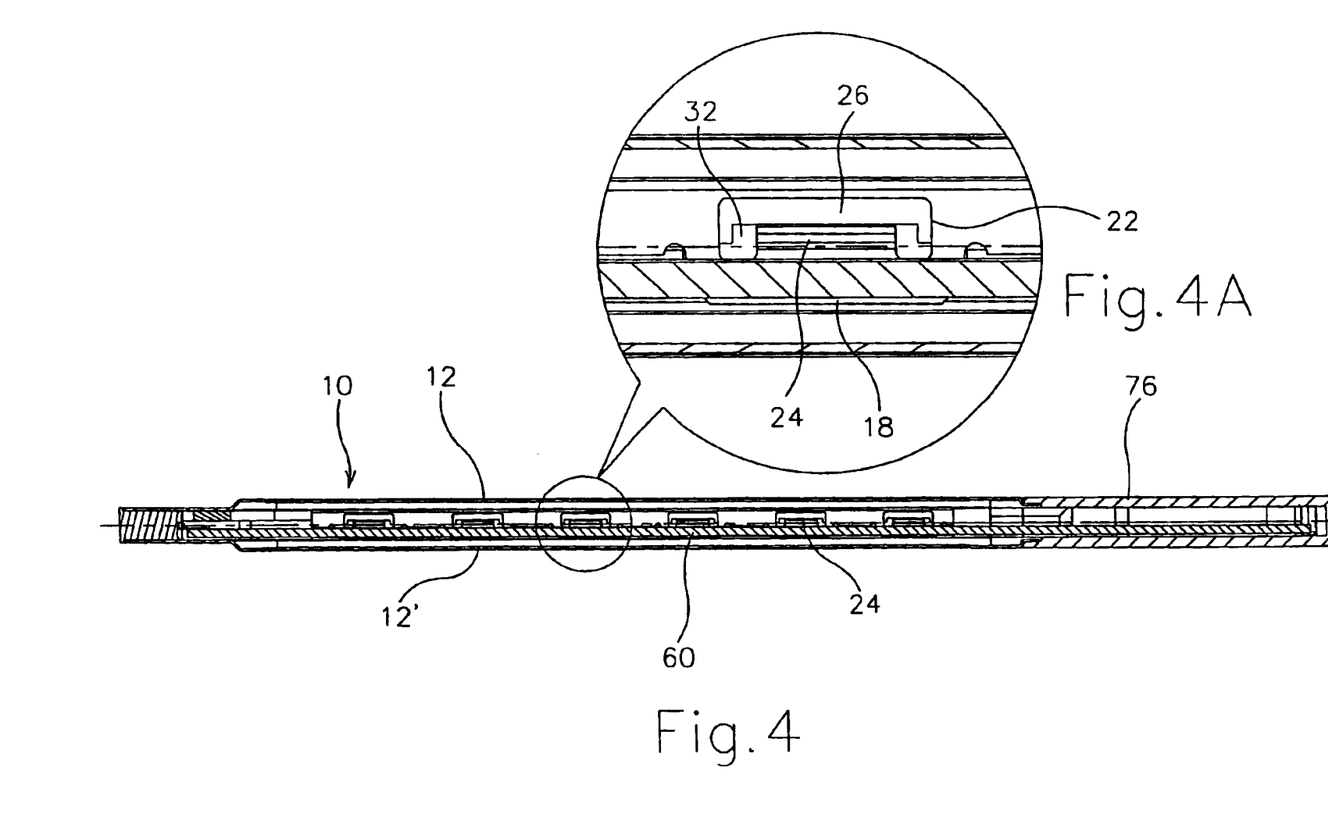
FIG. 4 and FIG. 4A are cross-sectional views of FIG. 1 along line A–A'.
Figures 5, 5A:
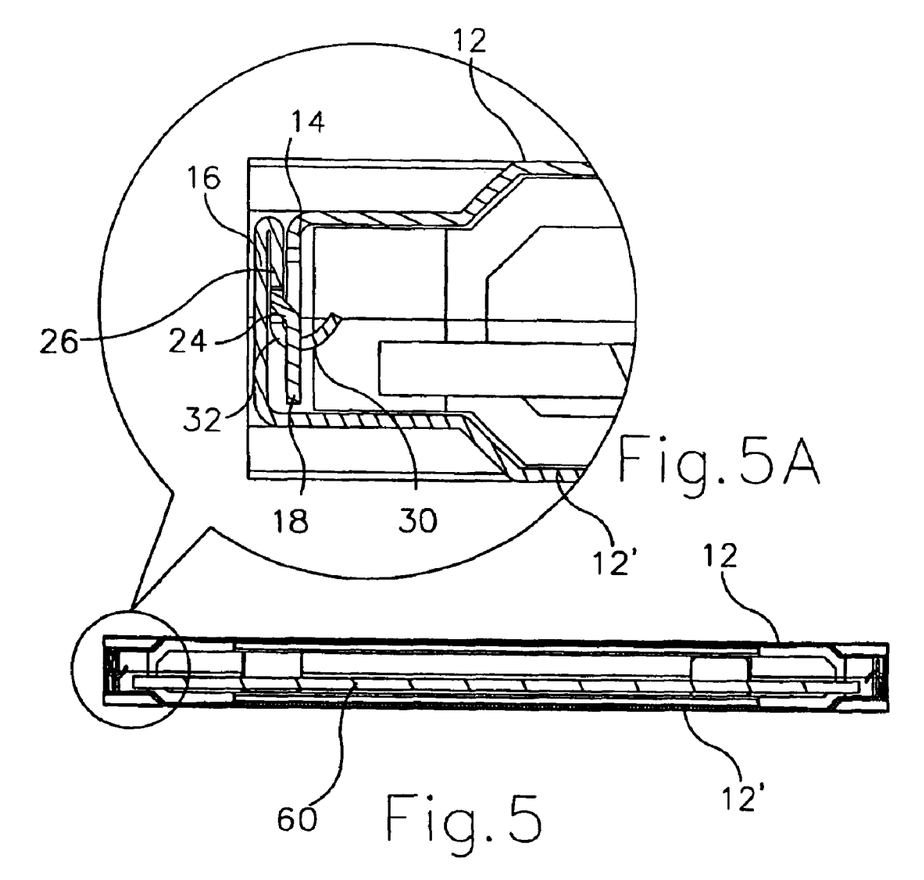
FIG. 5 and FIG. 5A are cross-sectional views of FIG. 1 along line B–B'.
Figure 6:
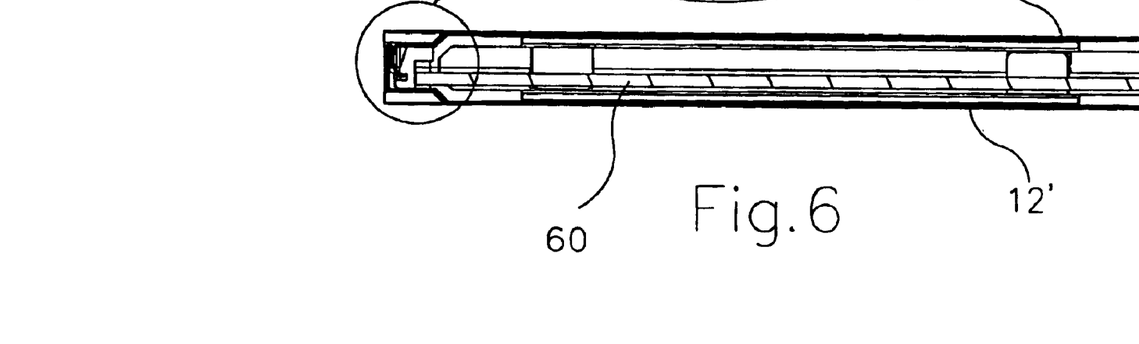
FIG. 6 and FIG. 6A are cross-sectional views of FIG. 1 along line C–C'.
Figure 6A:
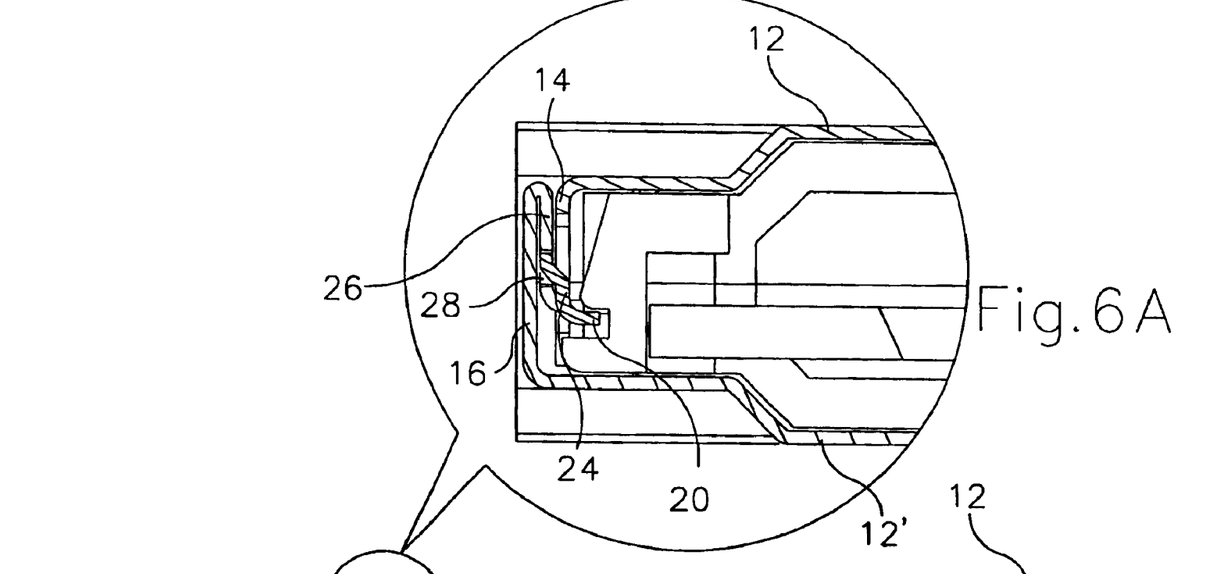

When the present invention is assembled, the two positioning grooves 50 on the frame 44 are first slipped on the first and second front insertion pieces 36 and 38 at two sides of the front extension end 34 of the cover body 12 to let the connection bodies 52 at the rear side of the frame 44 be respectively positioned at the front ends of the inner sides of the two bent portions 14 and 16 of the cover body 12. The positioning pieces 56 of the connector 54 are respectively retained in the two receiving spaces 48 of the frame 44 to let the circuit board 60 soldered at the rear end of the connector 54 be received inside the cover body 12. The insertion piece 78 of each of the rear covers 76 is slantingly inserted between the two connection sheets 74 to let the two connection sheets 74 abut against the front end of the rear cover 78, thereby retaining, the first and second rear insertion pieces 66 and 68 in the retaining trenches of the rear covers 76 and pulling flat the rear covers 76. Subsequently, as shown in FIG. 4 and FIG. 4A, the first bent portion 14 and the second bent portion 16 of the cover body 12' are respectively stuck on the inside of the second bent portion 16 and the outside of the first bent portion 14 of the cover body 12. Please also refer to FIGS. 5, 5A, 6 and 6A. When the two cover bodies 12 and 12' are assembled, the first positioning pieces 18 are inserted into the connection hoes 32 of the other cover body 12', and the top edge of the interference pieces 24 are retained at the top edge of the connection holes 32. Simultaneously, the interference piece 24 on the second positioning piece 20 is also retained at the top edge of the slot 28, thereby joining the two cover bodies 12 and 12' to cover the circuit board 60 up and down.

Figures 7, 7A, 7B:
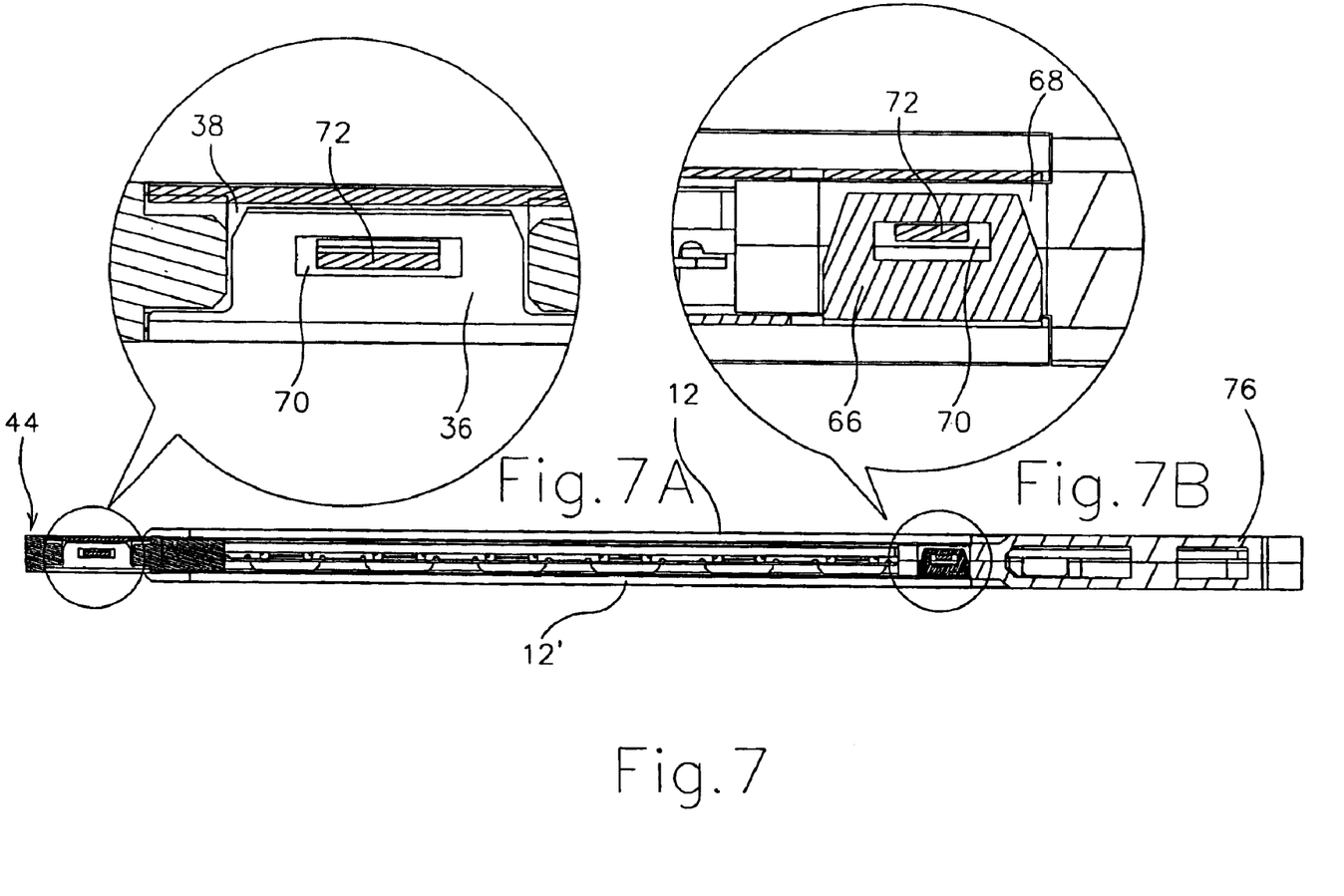
FIG. 7, FIG. 7A and FIG. 7B are cross-sectional views of FIG. 1 along line D–D'.

At the same time when the two cover bodies 12 and 12' are joined together, the first and second front insertion pieces 36 and 38 at two sides of the front extension end 34 of the cover body 12' respectively pass through the two positioning grooves 50 of the frame 44 to let the holes 30 of the first front insertion pieces 36 be retained with the sheet bodies 42 of the second front insertion pieces 38, thereby exactly assembling the frame 44 with the two cover bodies. 12 and 12', as shown in FIGS. 7, 7A and 7B. Moreover, when the two cover bodies 12 and 12' are joined together, the retaining trenches 82 of the two rear covers 76 penetrate through each other so that the first and second rear insertion pieces 66 and 68 can be inserted into the retaining trenches 82 simultaneously. Through the retaining of the holes 70 and the sheet bodies 72, the retained rear covers 76 and the two cover bodies 12 and 12' can be joined together. The design of the rear covers 76 will facilitate extraction out and insertion of an electronic card 10, and can enhance the whole strength of the electronic card 10.

Figure 1:
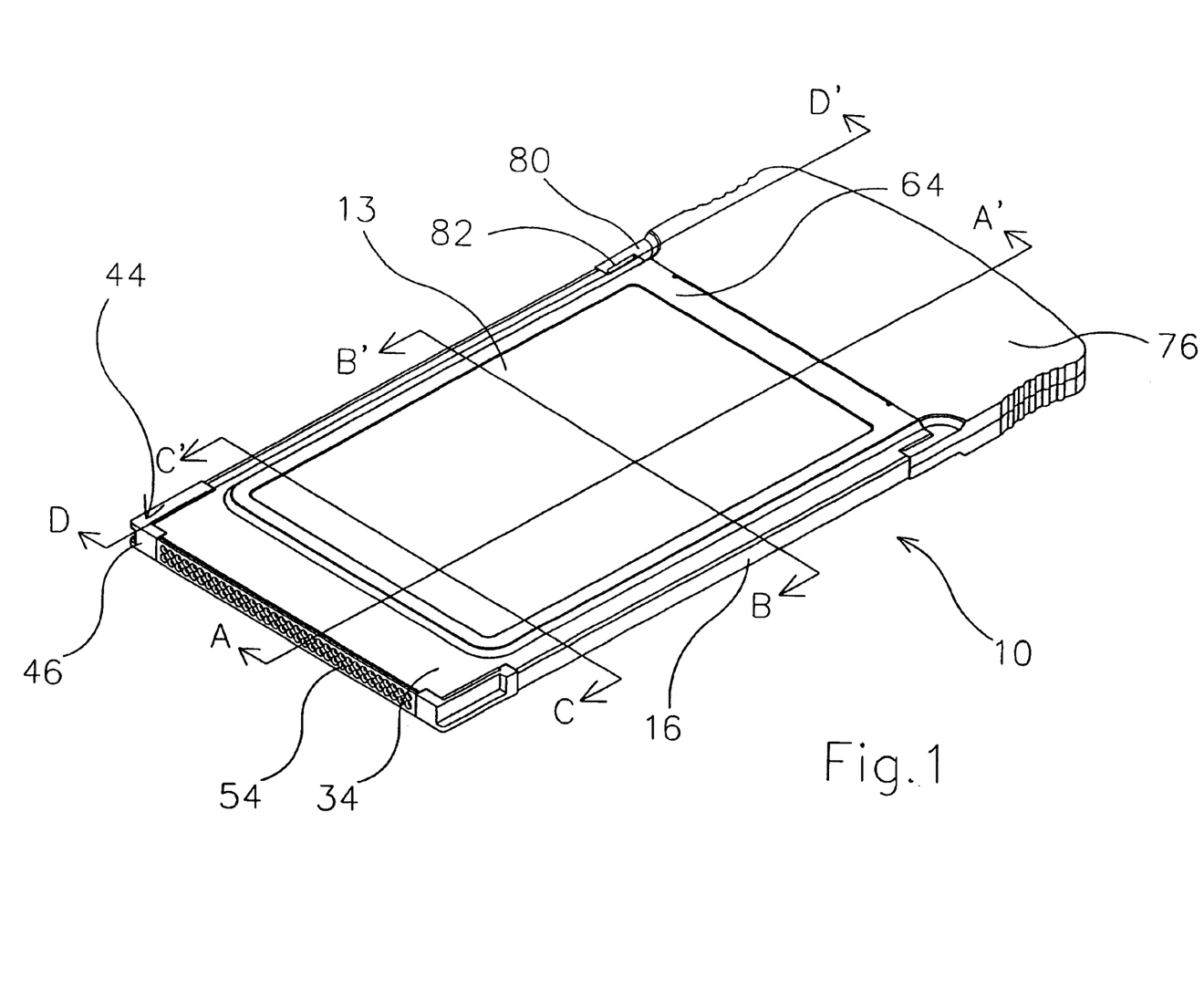
FIG. 1 is a perspective view of the present invention.

In the present invention, as shown in FIG. 1, because the connection holes 32 are disposed inside one of the two bent portions 16 of the cover bodies 12 and 12', the first and second positioning pieces 18 and 20 will be positioned inside the cover bodies 12 and 12' without leaving retaining traces. Moreover, when the present invention is assembled, because the connection holes 32 are disposed at the boundary between the bent pieces 26 and the hook bodies 30, the positioning pieces can be exactly limited and will not easily slide, hence achieving very high degree of joint. In addition that the joining procedure using supersonic wave, thermal glue, or blanket glue is not required, the assembly is simple, the production time can be shorten, and the cost can be reduced. Moreover, because of high degree of joint of the two cover bodies 12 and 12', the electronic card has good shielding effect and thus better grounding effect.

Because the present invention is retained and assembled by a user himself, the design of the electronic card 10 can vary according to the design or function requirements of the circuit board 60. The electronic card 10 can thus have more circuit design and expansion space within the limit of the specification of extension card. Moreover, only a frame 44 is disposed at the front end of the electronic card 10 to clamp a connector 54. Because there is no frame design in the space sheathed by the two cover bodies 12 and 12', the internal space of the electronic card 10 is increased to facilitate collocation and design of different circuit boards inside the electronic card. Moreover, because the rear covers 76 are joined together totally in retaining way, the conventional processing procedure of point welding can be omitted.

Figure 8:
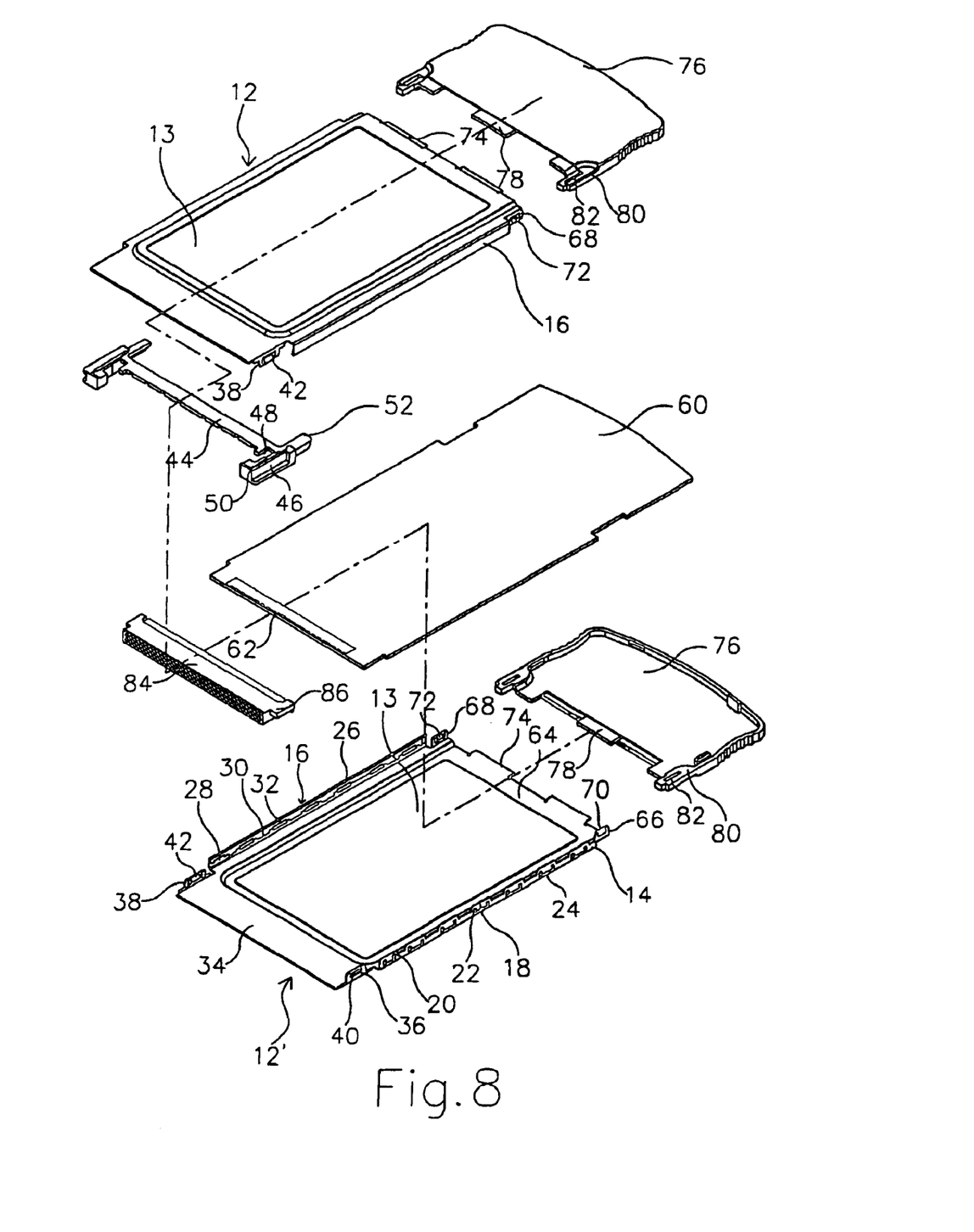
FIG. 8 is an exploded perspective view of the present invention with another kind of connector applied.
Figures 9, 9A:
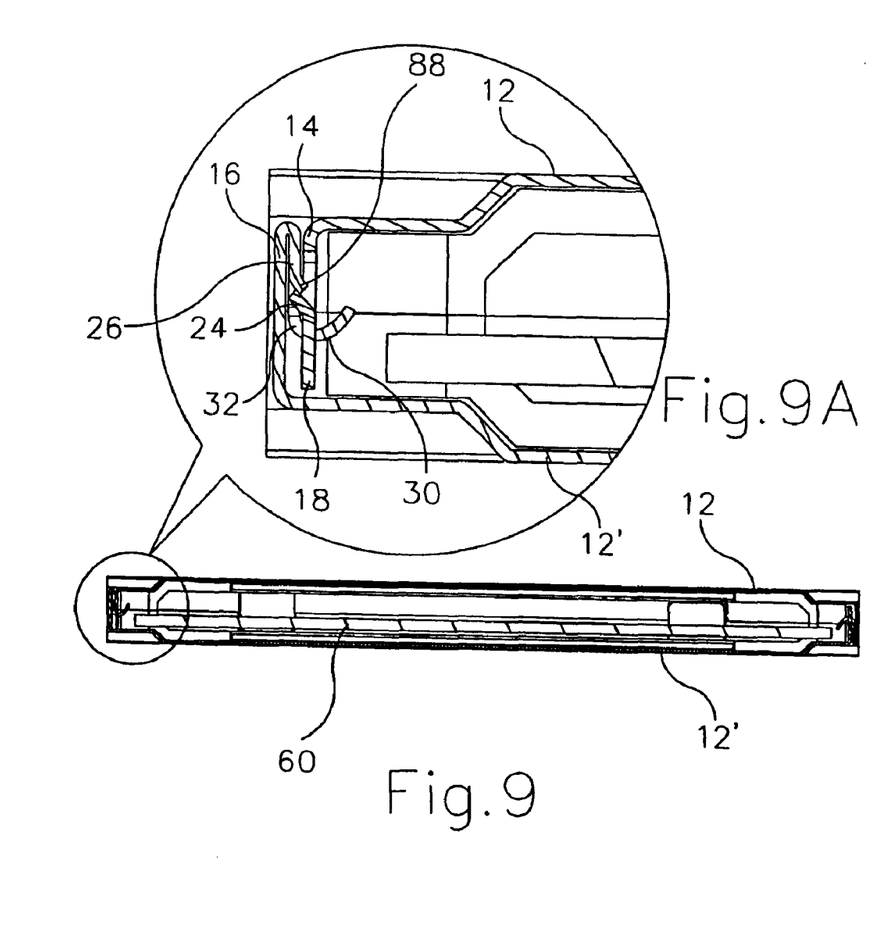
FIG. 9 and FIG. 9A are perspective views of FIG. 5 according to another embodiment of the present invention.
Figures 10, 10A:
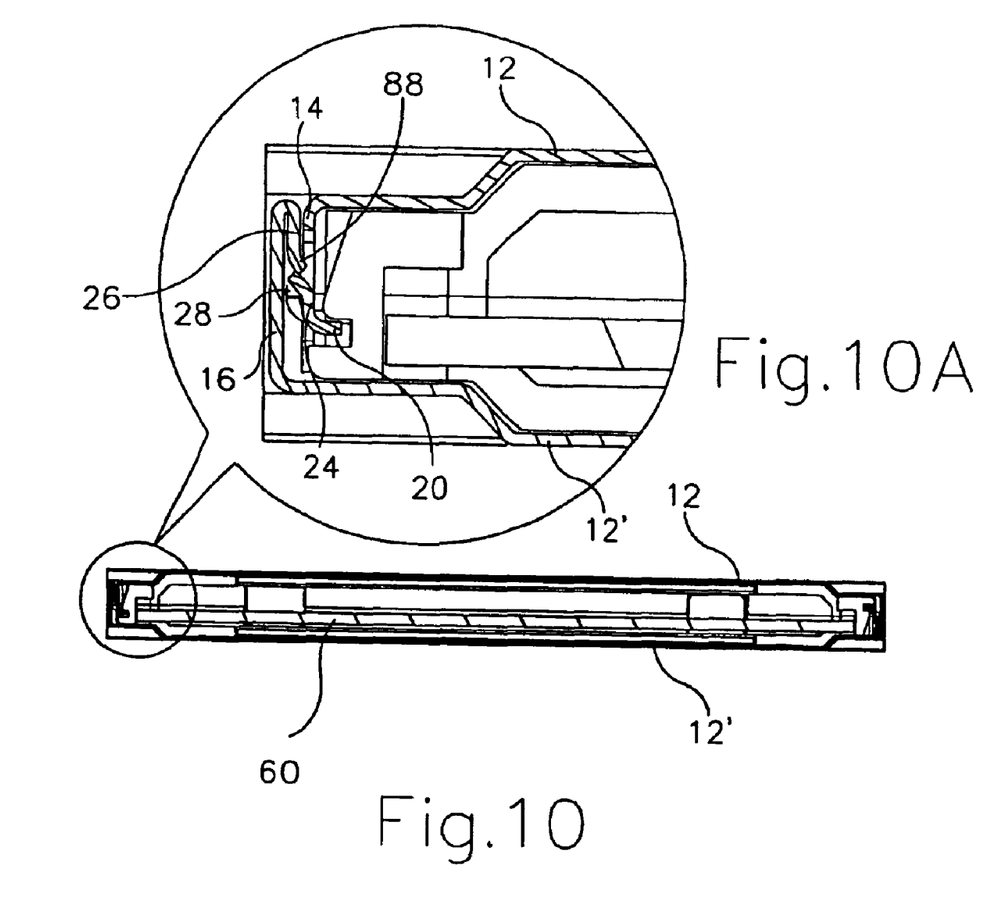
FIG. 10 and FIG. 10A are perspective views of FIG. 6 according to another embodiment of the present invention.

The joining way by retaining of the connector 54 and the frame 44 also applies to another type of connector 84. As shown in FIG. 8, fixing protuberances 86 project sideward from the rear ends of two opposite sides of the connector 84. The fixing protuberances 86 are fixedly retained in the receiving spaces 48 of the frame 44 to join the connector 84 and the frame 44 together. In other words, the present invention also applies to different types of connectors, hence increasing compatible interfaces of use of electronic card and letting the application range of electronic card be wider.

The top edge of the slot 28 and the top edge of the connection hole 32 can be extended downwards to form slanting pieces 88, as shown in FIGS. 9, 9A, 10 and 10A. When the two cover bodies 12 and 12' are assembled, the interference pieces 24 on the first and second positioning pieces 18 and 20 will be stuck with the slanting pieces 88 to enhance the degree of joint between the two cover bodies 12 and 12' with the help of the plane contact of the slanting pieces 88 and the interference pieces 24.

Figure 11A:
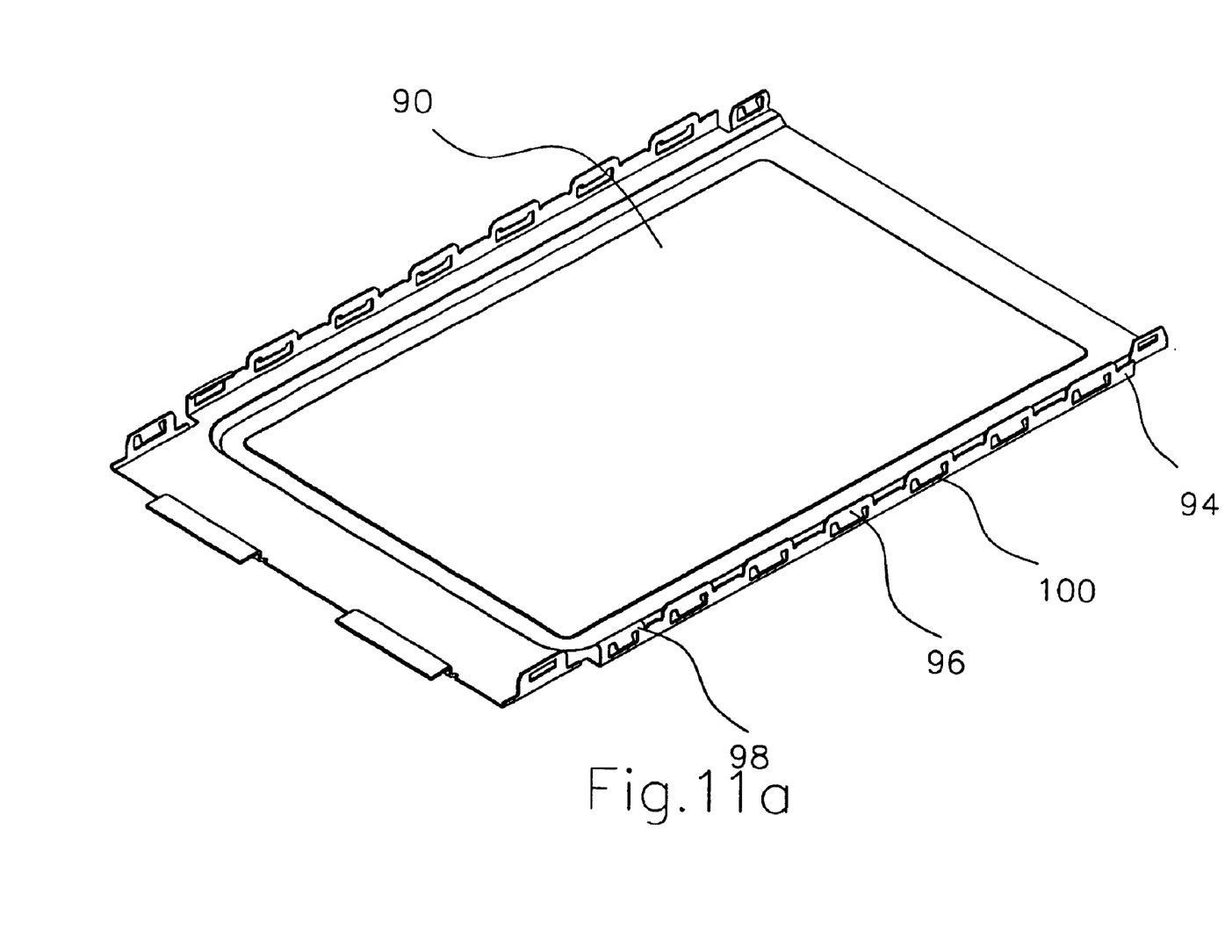
FIGS. 11A and 11B are perspective views of the cover body according to another embodiment of the present invention.
Figure 11B:
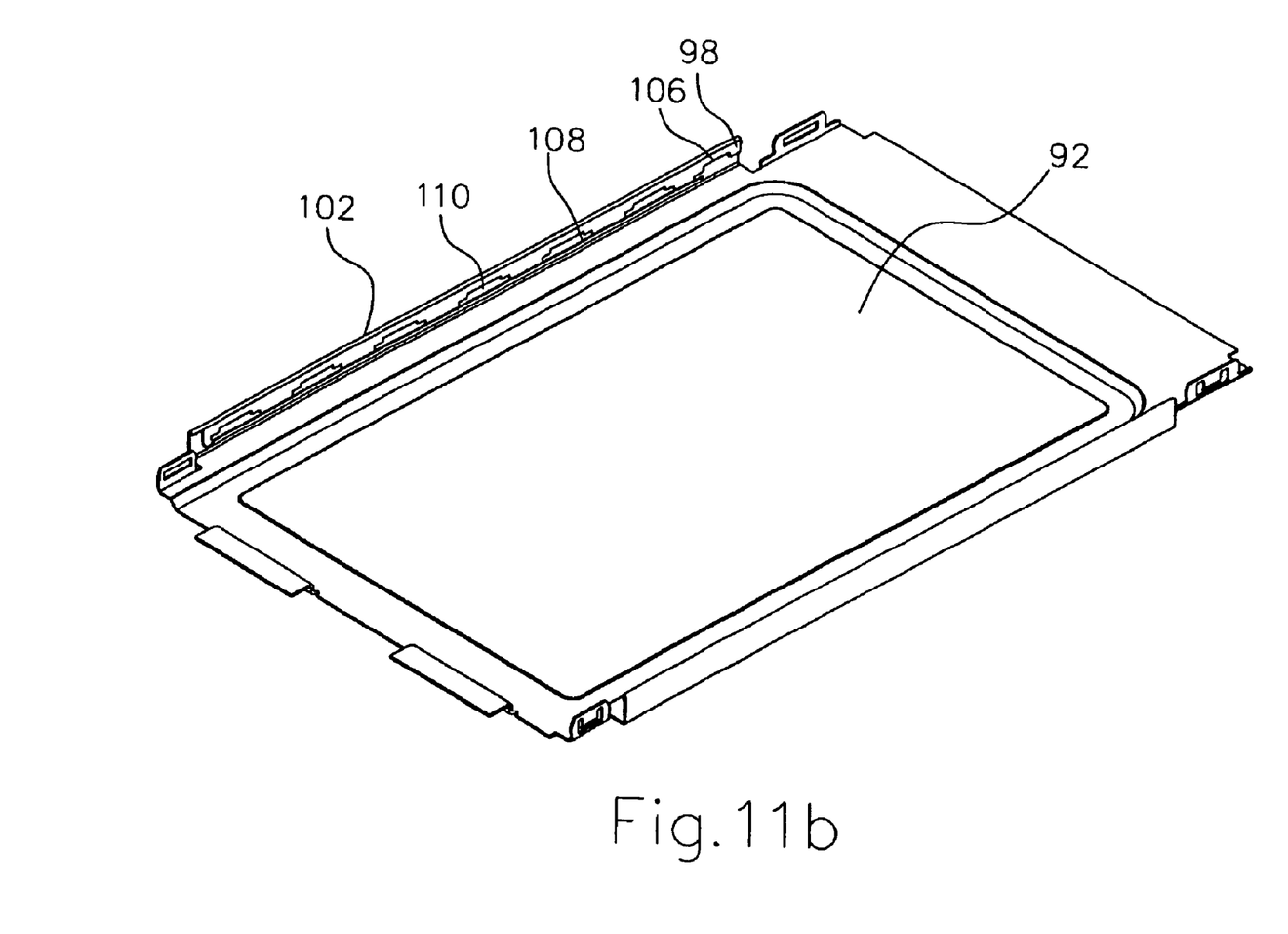

In addition to the above structure, the two cover bodies of the present invention can also be a cover body set shown in FIGS. 11A and 11B. The cover body set comprises a first cover body 90 and a second cover body 92. Two edges of the first cover body 90 are extended downwards to form first bent portions 94, each having a plurality of first positioning pieces 96 thereon. A second positioning piece 98 is disposed at the front end of the first bent portion 94. Interference pieces 100 are extended outwards from the surfaces of the first and second positioning pieces 96 and 98. Two edges of the second cover body 92 are also extended upwards to form second bent portions 102. The second bent portion 102 is bent inwards to form a bent piece 104. A slot 106 corresponding to the second positioning piece 98 is disposed at the front end of the bottom face of the bent piece 104. A hook body 108 is extended from behind the slot 106 and the bottom end of the bent piece 104. A plurality of connection holes 110 corresponding to the first positioning pieces 96 are formed at the boundary between the hook body 108 and the bent piece 104. The first bent portions 94 at two sides of the first cover body 90 are stuck inside the second bent portions 102 of the second cover body 92, and the first positioning pieces 96 are inserted into the connection holes 110 at two sides of the second cover body 92 so that the top edge of the interference piece 100 can be retained at the top edge of the connection holes 110. Simultaneously, the interference piece 100 on the second positioning piece 98 can also be retained at the top edge of the slot 106, thereby joining the first and second cover bodies 90 and 92 together up and down. Other structures of the first and second cover bodies 90 and 92 and their assembly relations with a frame and rear covers are the same as above and thus will not be further described.

Figure 12:
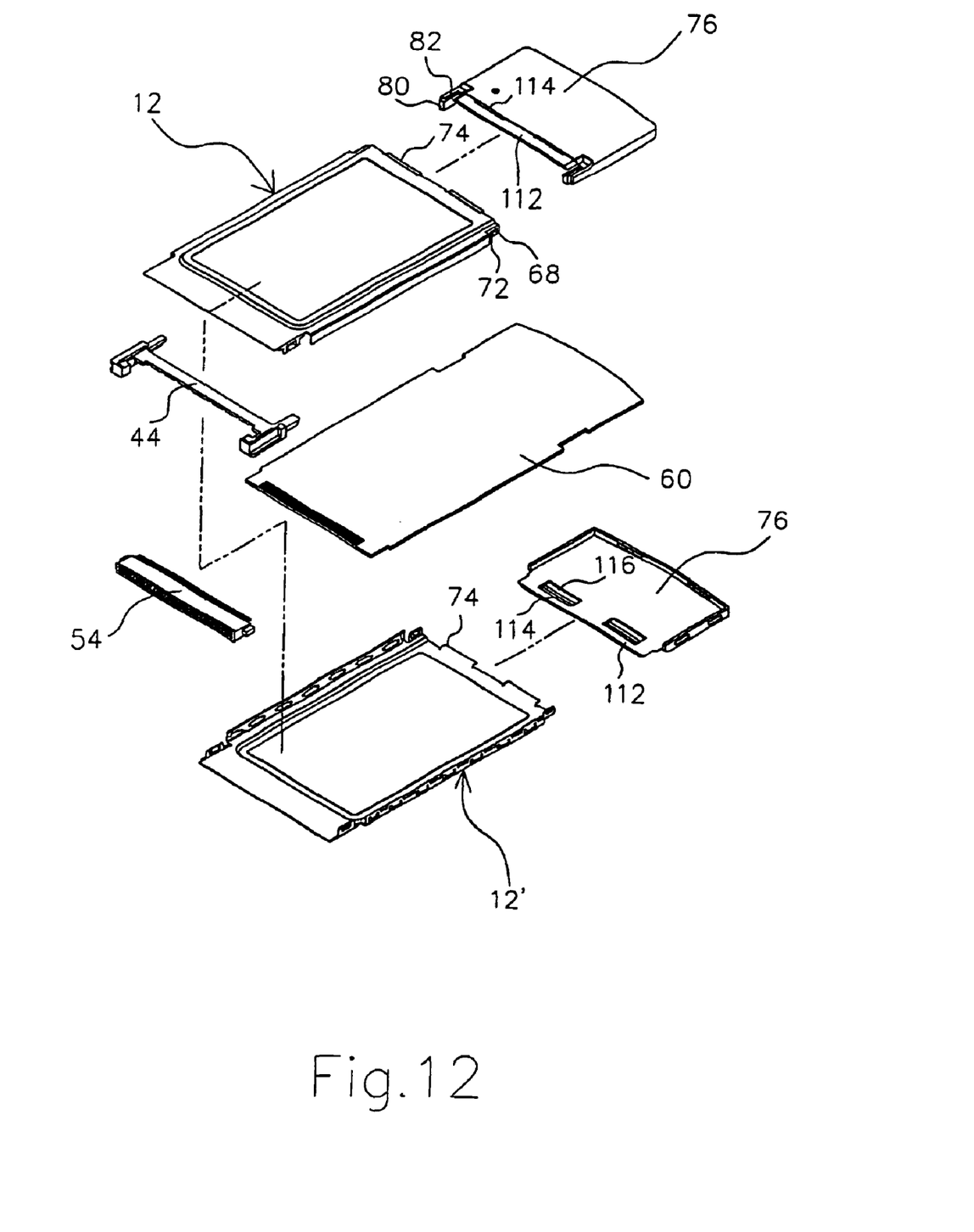
FIG. 12 is a diagram of a rear cover according to another embodiment of the present invention.

On the other hand, FIG. 12 shows another embodiment of the above rear cover structure. An extension piece 112 is disposed at the connection end of rear cover 76 and the cover bodies 12 and 12'. There exists a head between the extension piece 112 and the surface of the connection end. Two gaps 114 are formed between the extension piece 112 and the connection end. Positions of the two gaps 114 corresponding to those of the two connection pieces 74. Two shallow receiving in grooves 116 are formed at the front edge of the inner surface of the connection end and correspond to the gaps 114. The two connection pieces 74 of the two cover bodies 12 and 12' are slantingly inserted into the gaps 114 to match the connection base points of the cover bodies 12 and 12' and the rear cover 76. The cover bodies 12 and 12' and the rear cover 76 are bent flat to place the connection pieces 74 in the gaps 114 so as to tightly connect the cover bodies 12 and 12' and the rear cover 76 together. In the above structure of the rear cover 76, after the connection pieces 74 of the cover bodies 12 and 12' are slantingly inserted into the gaps 114 and bent flat, rear ends of the cover bodies 12 and 12' will be stuck with the extension piece 112 of the rear cover 76. The extension piece 112 can thus provide a support force for the cover bodies 12 and 12' to let the connection of the cover bodies 12 and 12' and the rear cover 76 be firmer.

When the electronic card is twisted, the connection position of the cover bodies 12 and 12' and the rear cover 76 will not be easily spread, thereby lengthening the lifetime of use and enhance the safety of use of the electronic card.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. An assembly structure of electronic card, comprising:

two cover bodies each being a main body whose two opposite edges respectively have a first bent portion and a second bent portion, a plurality of first positioning pieces being extended from said first bent portion, an interference piece being formed on each of said first positioning pieces, said second bent portion being bent inwards to form a bent piece, a hook body being extended from a bottom end of said bent piece, a plurality of connection holes corresponding to said first positioning pieces being disposed at a boundary between said bent piece and said hook body; a front extension end being formed at a front edge of said main body, front insertion pieces being disposed at two sides of said front extension end;

a circuit board with a plurality of circuit contacts at least disposed at one end thereof, said two cover bodies covering said circuit board up and down, said interference pieces of said first positioning pieces being retained with said connection holes to join said two cover bodies together;

a frame whose two opposite sides are extended to form clamping arms to form receiving spaces at two sides thereof, a through positioning groove being formed on a surface of each of said clamping arms, said two cover bodies being respectively positioned above and below said frame, said two front insertion pieces being inserted into said positioning grooves to join said frame with said two cover bodies;

a connector connected at one end of said circuit board, positioning pieces being disposed at two ends of said connector to be retained in said receiving spaces of said frame;

wherein a rear extension end is formed at a rear end of said main body, rear insertion pieces are disposed at two sides of said rear extension end, two rear covers retaining each other up and down are also provided, connection pieces are disposed at two sides of a front end of each of said rear covers, a through retaining trench is formed on each of said connection pieces, and said two rear insertion pieces pass through said retaining trenches to join said two cover bodies with said rear covers; and, two extension pieces are disposed at two ends of a rear side of said rear extension end, an extension piece is connected at a front edge of each of said rear cover, there exists a head between said extension piece and the surface of said rear cover, at least two gaps are formed between said extension piece and the front edge of said rear cover, positions of said gaps correspond to those of said connection pieces, said connection pieces are slantingly inserted into said gaps to match connection base points of said cover bodies and said rear covers so as to connect said cover bodies and said rear covers together.

2. The assembly structure of electronic card as claimed in claim 1, wherein two receiving grooves are formed at a front edge of an inner surface of said rear cover and correspond to said gaps, and said receiving grooves are used to place said connection pieces.

* * * * *